United States Patent [19]

Hoegl et al.

[11] Patent Number: 4,913,744
[45] Date of Patent: Apr. 3, 1990

[54] SOLAR CELL ARRANGEMENT

[76] Inventors: Helmut Hoegl, Seitnerstrasse 28, D-8023 München-Pullach; Ralf M. Kern, Assenbucherstrasse 67, D-8137 Berg, both of Fed. Rep. of Germany

[21] Appl. No.: 142,964

[22] Filed: Jan. 12, 1988

[30] Foreign Application Priority Data

Jan. 13, 1987 [DE] Fed. Rep. of Germany ....... 3700792

[51] Int. Cl.$^4$ .................... H01L 31/06; H01L 25/02
[52] U.S. Cl. .................... 136/244; 136/249; 136/255; 136/256; 136/263
[58] Field of Search .............. 136/244, 249 TJ, 255, 136/256, 263

[56] References Cited

U.S. PATENT DOCUMENTS

| 3,520,732 | 7/1970 | Nakayama et al. | 136/258 PC |
| 4,385,102 | 5/1983 | Fitzky et al. | 429/111 |

FOREIGN PATENT DOCUMENTS

| 3209548 | 10/1983 | Fed. Rep. of Germany | 136/256 |
| 57-26475 | 2/1982 | Japan | 136/255 |
| 57-26476 | 2/1982 | Japan | 136/255 |
| 59-125670 | 7/1984 | Japan | 136/244 |
| 59-143377 | 8/1984 | Japan | 136/255 |
| 59-144177 | 8/1984 | Japan | 136/244 |
| 60-42876 | 3/1985 | Japan | 136/244 |
| 60-94782 | 5/1985 | Japan | 136/244 |
| 61-29179 | 2/1986 | Japan | 136/263 |
| WO84/04425 | 11/1984 | PCT Int'l Appl. | 136/244 |

Primary Examiner—Aaron Weisstuch
Attorney, Agent, or Firm—Kirkpatrick & Lockhart

[57] ABSTRACT

In a solar cell arrangement comprising a plurality of solar cell elements having a photovoltaic layer around an elongate center electrode, each solar cell element as a whole forms an individual separate voltage cell with a counterelectrode. The construction may comprise different photovoltaically operative inorganic and organic materials and may assume various configurations. An electrode assembly for such a cell arrangement provides that center electrodes in wire or thread form which are disposed in parallel juxtaposed or superposed relationship are electrically connected together by way of photoactive layers encasing same. The solar cell arrangement may be produced by a continuous process of passing center electrode material through a plurality of working stations to provide the finished construction with photoactive layer structure thereon.

23 Claims, 4 Drawing Sheets

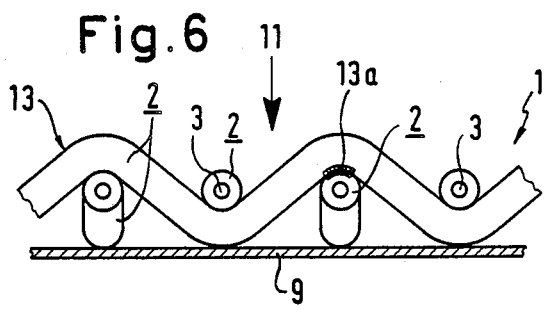
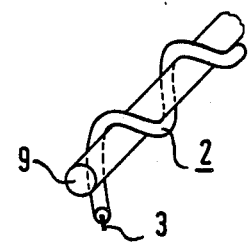
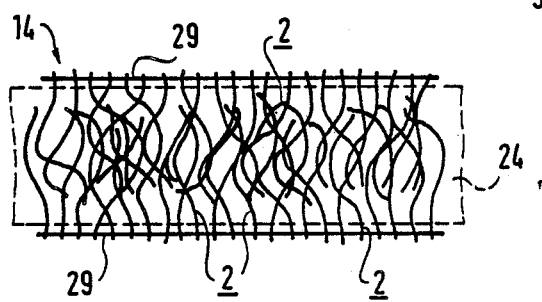
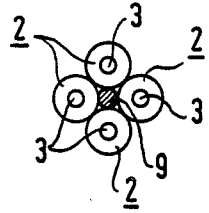
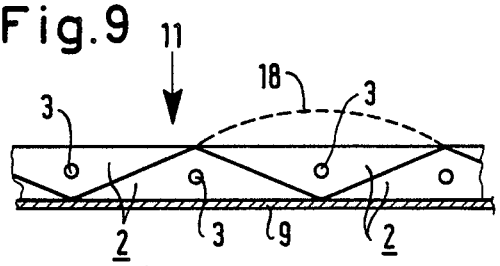
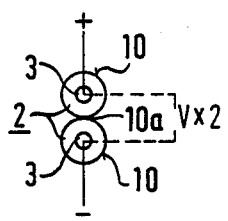
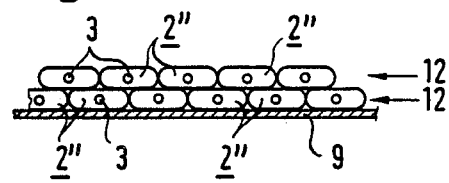

SOLAR CELL ARRANGEMENT

BACKGROUND OF THE INVENTION

The invention relates generally to a solar cell arrangement comprising a plurality of solar cell elements, an electrode assembly for such a solar cell arrangement, and a process for the production of such a solar cell In known photovoltaic cells, which are referred to hereinafter for the sake of brevity generally as solar cells, that electrode which is disposed on the photoelectrically operative layer which is towards the sunlight provides a considerable shading effect in regard to the free incidence of light on the arrangement. A large proportion of incident light is absorbed, before impinging on the photoelectrically operative layers, in a transparent, electrically conductive cover layer which is arranged on the side at which the light falls on the arrangement, acting as an electrode or as a part thereof.

When the photovoltaically generated electrical charges are taken from the specific location at which they are produced, to the metal electrode, serious voltage and current heat losses as well as high levels of recombination losses occur due to the charge paths which extend laterally transversely through the semiconductors layers of the arrangement.

SUMMARY OF THE INVENTION

An object of the present invention is to provide a solar cell arrangement in which the above-mentioned and other disadvantages of previous solar cells are eliminated or at least reduced.

Another object of the present invention is to provide a solar cell arrangement which provides for the production of energy in a simplified and more econimical fashion and which operates with a higher level of efficiency.

Still another object of the present invention is to provide a solar cell arrangement which is of a simplified modular-type construction.

A further object of the invention is to provide an electrode assembly for a solar cell arrangement, which can provide for greater versatility in use and operation thereof.

Yet a further object of the present invention is to provide a process for the production of a solar cell arrangement, which can be carrried out in a convenient and rational fashion and which affords a high degree of versatility for adapting it to different structural requirements in respect of the solar cell arrangement produced.

In accordance with the present invention, in a solar cell arrangement, these and other objects are achieved by an arrangement comprising a plurality of solar cell elements which have a photovoltaic layer around an elongate electrode. Each solar cell element forms as a unit, in itself, an individual, separate voltage cell with a counterelectrode. Each solar cell element may be of a wire-like or thread-like configuration.

Accordingly, solar cells of the arrangement in accordance with the princples of the invention are referred to generally hereinafter as "thread-like or wire-like solar cells". At their center they have an electrically conducting wire-like or thread-like electrode, in particular for example consisting of thin metal wire or metallized fabric threads, which is coated with photovoltaically operative semiconductor material. The electrical charge carriers which are produced under the influence of incident light in the semiconductor material are tapped off, in opposite-polarity form, at the radially outward perpheral surface thereof, in such a way that there are only two opposite-polarity connections or terminals for each solar cell element, namely one such terminal or connection at the electropde in the center of the solar cell, hereinafter referred to as the center electrode, and one connection or terminal at the outward side of the solar cell, and that the arrangement does not provide for example for subdivision of the cell, over the longitudinal iextent thereof, into a plurality of cell portions.

The above-indicated expression "thread-like or wire-like" embraces any cross-sectional shape in respect of the center electrode and the semiconductor coating or the external form of the thread-like or wire-like solar cell. It also includes for examples both a ssingle-thread or multi-thread center electrode and also a flexible or bendable or stiff or semi-stiff configuration of the treadlike or wire-like solar cell.

The wire-like or thread-like solar cells in accordance with the invention, in comparison with solar cells which are of a plate or panel-like configuration, produce, on the surface which is exposed to the incident light, a photoelectrically operative boundary layer or barrier layer surface, which is greater by a factor $\pi$(Pi) (factor 3.15), that is to say, a correspondingly higher current output, in current paths, which are at the same time very short, within the cell, namely linearly radially inwardly and outwardly respectively between the center electrode and the outer cell boundary. By virtue of the center electrode, at least 50% of the solar cell boundary layer surface which is increased in that way in accordance with the invention is exposed without a shadowing effect to the incident light, in addition preferably also in a cylindrical form, that is to say when considered in itself perpendicularly to the incident light. The arrangement of the photoectrically active semiconductor material around the center electrode, also provides that the remainder of the peripheral surface of the boundary layer of the solar cell according to the invention, which is behind the center electrode, also ensures that the incident light is put to use for photovoltaic purposes, preferably with a light refraction effect. For similar reasons, the surface of the wire-like or thread-like center electrode may also be metallized or made reflective by a metal coating.

The wire-like ir thread-like solar cells in accordance with the invention can be manufactured continuosly at a very high rate and can be combined to provide a very wide range of parallel layers and fabrics or non-woven fabrics and other arrangements and on the other hand can also be employed for the use not only of inorganic but in particular also organic photovoltaically operative substances or materials, instead of the inorganic semiconductor materials which hitherto have been the only materials used. It is precisely the thread-like or wire-like configuration that can provide for particuarly advantageous adaptation in repect of shape of the solar cell structure to organic material of that kind, which are not only cheaper in regard to production but which in addition can be shaped and deformed in particlly any manner and can be produced in very small layer thichkness. Thus, with the wire-like or thread-like solar cells according to the invention it is also possible to make them for example in the form of coatings with for exam- ple a woven fabric, as a component of structural elements. That would include the cladding, but also use as load-carrying elements, of wall elements, which are even of a round copfiguration, of wind energy rotors, for example Savonius wind generators.

As the photovoltaically operative coating with organic materials can be still thinner or easily also thicker than when using polycrystalline or amorphous inorganic materials, that affords the possibility of increasing the coefficient of absorption. With such thin coatings in respect of a center electrode, which are for example only a few μm in thickness, the cross-section of the thread-like or wire-like solar cell can be predominantly occupied by the center electrode. Such thin layers cannot be properly controlled in terms of contract, with the conventional procedures involving an electrode which is disposed on the side at which the incident light is to be found. Organic photovoltaically operative solar cell layers also ensure stronger and tighter bonding to the electrode surfaces. & A suitable material for the center electrode is for example electrically higly condcutive carbon fibers or metal wires or threads, comprising for example Ag, Cu, Al, Fe, W, Ni, Zn and the like, or electrically conductive alloys thereof and other electrically conductive alloys. A center electrode may also comprise glass fibers which are coated with a metal or metals or for example tin dioxides, or metallized textile fibers which are produced by means of known processes. In such a case the thichkness of the layer of metal may be between 0.5 and 25 μm and may also be electrochchemically strengthened.

The inorganic semiconductor material used may be materials which are known for that purpose such as selenium, silicon, copper oxide ($Cu_2O$), copper sulfide ($Cu_2S$) and cadmium sullfide (CdS) and the like, in particular in the known p- and n-doped areal doulble-layer form.

Organic photovoltaically operative substances or seminconductor materials which are used in accordance with the present invention may low-molecularr photoactive donor compounds.

It has been found that almost any organic aromatic or heterocyclic substance is suitable for use in accordance with the invention, with or without electron-donating substituents, except possibly for hygroscopic substances. Electron-donating molecule groups are alkyl, alkoxy, amino groups and the like. Suitable aromatic donor substances are for example anthracene, chrysene, pyrene and triphenylamine, while suitable heterocyclic donor substances are for example carbazole and 2-bis-(4'-diethylaminophenyl)-1,3,4-oxidiazole.

In accordance with the invention those compounds must be applied by means of inert binding agents to the center electrode and to the inner photoactive layer respectively.

High-molecular of polymer donor substances have the particular advantage, in regard to the use according to the invention, that they can also be applied without additional binding resins. Typical representatives of that class are polyvinyl aromtics and heterocylces and polymers and copolymers of aromatic substances which carry a double bond on a ring which is condensed thereon, for example 2-polyvinylnaphthalene, 3-polyvinylpyrene, N-polyvinylcarbazole and polyacenaphthylene.

Organic low-molecular photactive acceptor compounds which may be used in accordance with the invention are preferably substances which carry highly electronegatively polarizing residues or groups such as cyano and nitro groups; halogens such as fluorine, chlorine, bromine and iodine; ketone groups, ester groups, acid anhydride groups; and acid groups such as a carboxyl group or the quinone grouping. The aromatic and heteroaromatic acceptor substances are themselves photoactive, particularly when they are doped with suitable donors (as set forth above). If the acceptor substances are low-molecular, that is to say they are not resin-like, then for the application thereof as a photoactive layer, they require the addition of suitable inert binder resins.

Typical examples of electron acceptors are 1.5-dinitronaphthalene, 2,4,7-trinitrofluorenone, 4,7-trinitrofluorenone, tetrachlorophthalic acid anhyride, 1,2-benzoanthraquinone, 9-acetylanthracene and s-tricyanobenzene.

High-polymer acceptor substances which contain highly electronegatively polarizing residues are less frequent. Weak acceptor polymers are for example aromatic polyesters (such as polyethylene glycol terephthalate) and polycarbonates.

The invention also provides in a preferred feature thereof that inorganic semiconductor materials and photoactive organic substances may be combined together for example in such a way that an inorganic donor layer with an organic acceptor layer (high or low molecular) forms a barrier layer arrangement or conversely a donor layer of organic material with an acceptor layer of inorganic material is used. The inclusion of intermediate layers of intrinsically operative, undoped (i—) layers is also possible in combination, comprising organic and/or inorganic material.

The photovoltaic effect of the above-mentioned semiconductor materials and in particular the organic photovoltaically operative materials which are used in accordance with the invention may be improved by the use of color sensitizers. Color sensitizers which are suitable for shifting the sensitivity from the ultra-violet range into the range of visible light generally themselves have photoelectric properties, that is to say they are photo-conductive and have photovoltaic properties. Their dark conductivity however is generally higher than that of colorless or faintly colored photoelectric substances.

Color sensitizers already have sensitizing effects in respect of very small amounts of coloring material, for example less than 0.01% by weight. In general, however, from 0.01 to 5% by weight and preferably from 0.05 to 3% by weight of color sensitizer is added in accordance with the invention to the photoactive layers.

The following are given by way of examples of color sensitizers which can be used in a satisfactory and in some cases highly satisfactory manner:

Triaryl methane dyestuffs such as Brilliant Green or Methyl Violet;
Xanthene dyestuffs such as Rhodamine B and Rhodamine 6G;
Phthaleins such as Eosin A, Rose Bengale and Fluorescein;
Thiazine dyestuffs such as Methylene Blue;
Acridine dyestuffs such as Acridine Yellow, Acridine Orange and Trypaflavine;
Quinoline dyestuffs such as Pinacyanol and Kryptocyanine;
Cyanine dyestuffs such as Cyanine etc.

In accordance with the invention it is also possible to use activators for sensitizing of the photoactive substances, and they may be used in particular in combination with organic photoactive substances.

Activators themselves do not have photoelectric properties but they can often quite considerably increase the photosensitivity of photoactive substances. Very many photoactive substances preferably absorb light in the ultra-violet range (such as for example polyvinlycarbazole and polystyrene). The sensitivity thereof can be increased by adding activating substances which can form therewith what are referred to as charge transfer complexes. They occur in accordance with the invention in molecule complexes of the donor acceptor type (charge transfer complexes), either as electron donors (Lewis acids such as for example hydrochloric acid HCl, organic carboxylic and sulfonic acids, metal halides) or as electron acceptors (Lewis bases such as for example sodium hydroxide NaOH or ammounium compounds).

The amount of activator which is advantageously added to the photovoltaic substances fluvtuates in accordance with the carrier substrate and is generally from about 0.01 to 100 moles with respect to 1000 moles of the photoactive substance. It is also possible to use mixtures of a plurality of activators. Furthermore, it is also possible to add sensitizer dyestuffs.

In accordance with the invention, by the addition of such activating substances it is possible to produce photoconductive layers which have a high level of photosensitivity, in particular in the ultra-violet range, and which are practically colorless. Thus, by means thereof, it is possible to strongly activate the photoactive layers in the ultra-violet range and then also to obtain a high level of sensitivity in respect of visible light, by a very small addition of color sensitizer, without having to add so much color sensitizer that the layer is heavily colored.

The use according to the invention of organic photovoltaic compounds gives a very wide range of possible combinations with activators and/or color sensitizers. That is an aspect of major advantage in regard to optimum use of the available light. The organic substances may be used in the form of individual layers with inorganic photoactive layers. That thus provides the combinations set out below (PVCa=N-polyvinylcarbazole, TNF=2,4,7-trinitrofluorenone with a suitable plastic binding agent, hydrochloric acid and sodium hydrochloride =typical Lewis acid and Lewis base respectively, Rhodamine B and Methylene Blue=randomly selected colour sensitizers).

| No. | Photoactive substrate | Doping agent | Activating agent | Color sensitizer |
|---|---|---|---|---|
| 1 | PVCa-donor | — | — | — |
| 2 | PVCa-donor | TNF-acceptor | — | — |
| 3 | PVCa-donor | — | HCl-acid | — |
| 4 | PVCa-donor | — | — | Rhodamine B |
| 5 | PVCa-donor | TNF-acceptor | HCl-acid | — |
| 6 | PVCa-donor | TNF-acceptor | HCl-acid | Rhodamine B |
| 7 | PVCa-donor | — | HCl-acid | Rhodamine B |
| 8 | PVCa-donor | TNF-acceptor | — | Rhodamine B |
| 9 | TNF-acceptor | — | — | — |
| 10 | TNF-acceptor | PVCa-donor | — | — |
| 11 | TNF-acceptor | — | NaOH-base | — |
| 12 | TNF-acceptor | — | — | Methylene Blue |
| 13 | TNF-acceptor | PVCa-donor | NaOH-base | — |
| 14 | TNF-acceptor | PVCa-donor | NaOH-base | Methylene Blue |
| 15 | TNF-acceptor | — | NaOH-base | Methylene Blue |
| 16 | TNF-accptor | PVCa-donor | — | Methylene Blue |

In accordance with the invention the above-mentioned donor layers may be combined together with the above mentioned acceptor layers to form double layers which in turn have higher levels of photsensitivity than the individual layers. Organic donor layers may also be combined with inorganic acceptor layers, for example selenium layers with PVCa layers. Conversely, inorganic acceptor layers may be combined with organic donor layers to provide double layers.

In order when using organic substances to achieve a volume effect as in the case of the known barrier layer photcells comprising inorganic materials (for example silicon), it is necessary to provide a pn-junction which is at least a few hundredths of to about ten micrometers from the surface thereof. The conductivity type of the layer is therefore converted into the opposite conductivity type within a portion of the volume adjacent the surface. In that way it is possible to achieve very high yields in the conversion of optical into electrical energy.

In accordance with the invention for example that can be achieved by the following combinational arrangements:

| | Center Electrode | Photoactive double-layer thread-like cells | | Outer counter-electrode of the cell | Transparent protective casing |
|---|---|---|---|---|---|
| | | Photoactive layers | | | |
| | | Inner | Outer | | |
| 1 | Cu-wire | PVCa-donor layer + additives as above | TNF-acceptor layer + additives | Conducting lacquer applied in a spiral form | Polymethyl-methacrylate |
| 2 | Aluminum wire coated with cadmium | Selenium acceptor (vapour deposit) | PVCa-donor layer + additives | Vapor-deposit tin oxide conducting contact | Polybutyl methacrylate by glow discharge |
| 3 | Aluminum wire | Amorphous silicon vapour deposit p-conducting by virtue of boron doping | TNF-acceptor + additives | Conducting lacquer | Polymethyl-methacrylate |

The solar cell arrangement in accordance with the invention and in particular the circuitry association of the invention in respect of center, electrodes and thread-like or wire-like solar cells, which are arrag arranged in parallel juxtaposed relationship, can also provide for an increased range of options in regard to the combination of p-i-n-layer arrangements, that is to say the inclusion of a known intrinsic (i—) layer which preferably has a completely undoped action, in the junction from the p- to the n-layer and from the n-to the p-layer respectively or in the form of tandem arrangements (that is to say dual series circuit arrangements), in other words, in the form of an (electrode-p-n-i-p-n-electrode) arrangement, for example between a respective pair of juxtaposed center electrodes which in that way become counterelectrodes of each other. A further intrinsic (i—) layer may also be provided in that array of layers in each case between the p- and n-layer, that is to say, as a reinforced barrier layer.

In regard to an electrode assembly, the present invention also provides an electrode assembly comprising a plurality of electrodes wherein thread-like or wire-like center electrodes which are disposed in mutually parallel juxtaposed or superposed relationship and at an angle relative to each other are electrically connected together by way of their encasing photoactive layers.

As an alternative thereto, an electrode assembly in accordance with the invention may also provide that jointly associated with the wire-like or thread-like center electrodes which are disposed in parallel juxtaposed relationship is an areal or generally flat counterelectrode which is arranged on the side remote from the incident light and which is electrically conductively connected over at least the major part of the longitudinal extent of the solar cells to the outside of the semiconductor material casing thereof. That also applies in accordance with the invention when the flat counterelectrode is subdivided lengthwise into strips or ribbons.

If the thread-like or wire-like solar cell elements are connected together in accordance with the invention in a woven or braided or interwoven arrangement, then the warp and weft threads may be formed in regard to the cross-section thereof by respective opposite p-n-layer assemblies (or p-i-n-layer assemblies), so that there is a tandem circuit arrangement at the warp and weft thread contact points and the center electrodes of both kinds of thread are connected in series at each thread intersection location. For that purpose the warp threads or the weft threads (or both) may additionally be provided with an outer layer of intrinsic (i—) material, or by way of which the tandem contact may occur. In addition at the points of intersection referred to above, the arrangement may also involve fusion of or a strond electrically conductive connection between the respective intersecting threads.

In the simplest form however a woven structure in accordance with the invention for such an electrode assembly may be built up in the weft and warp directions from thread-like or wire-like solar cell elements which are of the same structure and which are electrically connected at the outward side of their semiconductor layer casing with a counterelectrode which is arranged on the side remote from the incident light and which is preferably or an areal or flat nature and which may be also foil-like.

In the case of individual solar cell elements in accordance with the invention which are only arranged in juxtaposed relationship, the counterelectrode may be provided on the outside peripheral surface which is remote from the incident light, in the form of a metallization coating, which has a reflecting effect similarly to a concave mirror.

The above-mentioned, preferably flat counterelectrodes may also be reflective. The shape of the surface of a solar cell element, which in particular is of a round or convex cross-section, ensures on the one hand that the arrangement has a surface portion which is always directed perpendicularly relative to the position of the sun, in other words such as not to involve any reflection phenomena, and on the other hand it provides for absorption of the received light by reflection at the boundary layers of the inner regions of the solar cell element. For that purpose however it is also possible for the solar cell elements to be of different cross-sectional configurations, for example of an oval or prismatic cross-section. The use of combined organic and/or inorganic solar cell layers also increases the choice of materials with a high degree of difference in refractive index and thus improved utilization of the total reflection of light, once it has been received.

In addition, an electrically conducting thread or wire may also be provided as the counterelectrode, with a thread-like or wire-like solar cell element being wound in a spiral or coiled configuration around that counterelectrode.

A plurality of thread-like or wire-like solar cell elements may also be arranged in an anular configuration (as considered in cross-section) or in the form of a bindle around a counterelectrode which is arranged concentrically with respect thereto and whose electrically conducting surface bears in each case along and against the outward sides of the solar cell elements.

Composite arrangements of solar cell elements of that kind may also be twisted together in a cable-like structure, with the counterelectrode being arranged in a similar fashion to a cable core.

In a particularly advantageous embodiment in accordance with the principles of the present invention, the outer counterelectrode may also comprise an electrically conductive plastic material, for which purpose it is possible to use both conductive polymer compounds and polymers which involve what is referred to as intrinsic electrical conductivity. The conductive polymer compounds are plastic materials with incorporated conductive fillers such as for example aluminum powder, graphite powder or soot and steel fibres. Examples of intrinsically conductive plastic materials are plastic materials doped with suitable electron donors (for example metal atoms) or electron acceptors (for example iodine atoms), such as for example polyacetylene, polypyrrole, polyparaphenylene, polyphenylene sulfide, and polythiophene as well as polymer metal complexes of phthalocyanine, in particular also co-extrudates of the aramid polymer known as Kevlar with pthalocyanine polymers.

For the purposes of reinforced use in a flat configuration, in accordance with the invention it is also possible for a plurality of parallel layers of solar cell elements to be arranged in a laminate structure in superposed relationship, preferably in such a way that the center electrocdes of the superposed layers are displaced relative to the electrodes of the respective adjacent layers in such a way as to be aligned with the gaps therebetween. In such an arrangement, in order to make full use of the light wave spectrum, the various layers may comprise different semiconductor materials and may also be of different thread diameters.

For that purpose, the counterelectrode may again be in the form of an electrically conducting and possibly reflecting surface on the side which is remote from the incident light.

Alternatively, the individual center electrodes either of the superposed layers or of the juxtaposed solar cell elements may also serve in alternate relationship with each other as the counterelectrodes in a tandem array, with suitable p-n- and n-p-coating and p-i-n or n-i-p-coating respectively.

Both individual thread-like or wire-like solar cell elements and also solar elements which are combined in the above-indicated manners may be provided with a covering or insulating resing to provide for insulation of the solar cell elements relative to each other and to act as an electrical protective coating, with such covering or insulating resin also being effective to prevent oxidative decomposition and light ageing.

In accordance with the invention, by means of a polymerization operation, for example in respect of the monomers methylmethacrylate, n-butylmethacrylate or ethylsilicate, by glow discharge, the photoactive layer, possibly including the counterelectrode thereof, may be coated with a strong and firm, thoroughly polmerized, homogeneous dielectric layer of from 0.01 to 1 micrometer, with a high level of resistance.

In accordance with the invention, to enhance the degree of efficiency, it is also possible to add to that layer flourescent dyestuffs which provide for wavelength transformation into the absorption range of the photoactive barrier layer.

In accordance with the invention, any suitable transparent and non-conducting, natural or synthetic resin may be used for producing an electrically insulating protective coating as referred to above. The electrically insulating plastic materials that may be used in accordance with the invention include both thermoplastic polymers and also hardenable moulding and pressing materials such as, for example, polyethylene and other polyolefins as well as vinyl polymers and copolymers, but in particular the various methacrylates and halogen-bearing vinyl polymers, polyethers, polycarbonates, polyesters, polyacetates, polyamides, polyimides, polyester imides, polysulfones, polyurethanes, silicone resins, and cellulose derivatives. Other materials include phenoplasts, aminoplasts, alkyd resins, polyester resins, unsaturated polyesters and epoxy resins.

The thread-like or wire-like solar cells which are arranged in accordance with the invention may also be used in a very wide range of other forms, thus for example as inside and outside wall claddings or linings (for example as structured tapestry items), as curtain items for making use of window areas, and for example also for the hydrolysis of hydrogen with an enlarged active electrode surface areas as for example in the known Fujishima-Honda-cell ($TiO_2$, optionally strontium doped, center electrodes coated with other inorganic or organic semiconductors) as an anode for the production of hydrogen. In that situation, use of the arrangement in accordance with the invention, as tandem cells, provides a voltage which can be used directly for the hydrolysis operation. The fleece-type or non-woven fabric-like arrangements according to the invention are also suitable for that use.

In accordance with yet another aspect of the invention, in a process for the production of a solar cell arrangement consisting of thread-like or wire-like solar cells, a thread-like or wire-like metal or electrically conductive center electrode is sujected in a continuous procedure successively to cleaning, coating, doping and heat treatment steps and the continuous run of center electrode, which has been provided with the finished photoactive coating, is divided up into portions of given lengths and the portions are associated with each other in the required relationship.

Further objects, features and advantages of the present invention will become apparent from the following description of preferred embodiments thereof.

BRIEF DESCRIPTION OF THE DRAWINGS

FIG. 6 is a partly broken-away view in longitudinal section through a modified embodiment of the invention in the form of a woven fabric structure, FIG. 7 is a partly broken-away perspective view of another modified embodiment of the invention, FIG. 8 is a plan view of a partly broken-away diagrammatic view of a modified embodiment of an arrangement according to the inveniton, in the form of a fleece or non-woven fabric structure, FIG. 9 is a view in cross-section of a portion of a flat arrangement of modified solar cell elements of the solar cell arrangement according to the invention as shown in FIG. 1, FIG. 10 is a view in cross-section of a portion of another embodiment of solar cell elements of a solar cell arrangement according to the invention approximately similar to that shown in FIG. 5, FIG. 11 is a diagrammatic view in cross-section of a further embodiment of a solar cell arrangement according to the invention, for example in the form of a bundle or a cable-like structure, FIG. 12 is a diagrammatic view in cross-section of a solar cell arrangement which is connected in series or in tandem relationship in accordance with the invention, with a modified electrode assembly.

DESCRIPTION OF PREFERRED EMBODIMENTS

Figure 1:
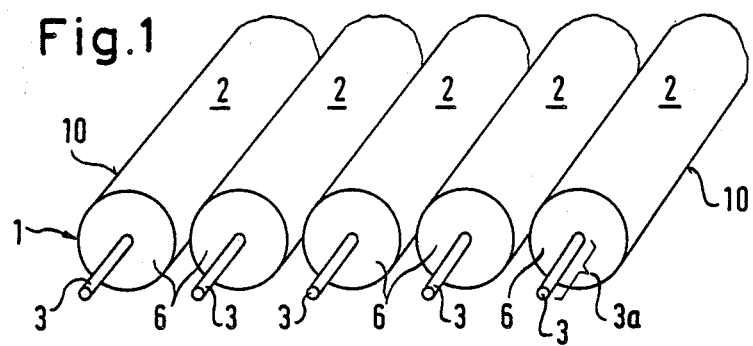
FIG. 1 is a partly broken-away perspective view of a basic embodiment of a solar cell arrangement in accordance with the principles of the invention.
Figure 3:
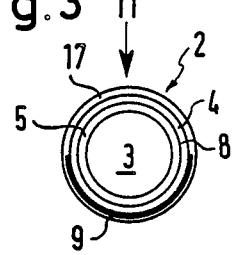
FIG. 3 is a view in cross-section of an embodiment of a solar cell element as shown more particulary in FIG. 2, in accordance with the invention.

Referring firstly to FIG. 1, shown therein is a solar cell arrangement 1 comprising a plurality of wire-like or thread-like solar cells 2 which are arranged in mutually parallel juxtaposed relationship and which each comprise, around the center electrode 3, a photovoltaically operative layer 6 comprising for example a suitable semiconductor material, as set forth hereinbefore. The layer 6 which is disposed coaxially around the center electrode 3 may comprise a plurality of different layers, for example as shown in FIG. 3, as considered from the center electrode in an outward direction, a semiconductor layer 5, an n-semiconductor layer 4, a barrier or junction layer 8 which is formed between the layers 5 and 4, and possibly an insulating layer 17 which protects the outward surface 10 and which may also embrace a counterelectrode 9 possibly provided on the outward surface 10 of the layer 6. It may be noted at this point that the production of the wire-like or thread-like solar cells is effected more particularly in continuous mode of operation which involves the center electrode passing successively through necessary surface cleansing and coating stations, in the form of a practically infinitely long thread or wire. In passing through those operating stations, the center electrode material is firstly cleaned for examples by means of a glow or corona discharge and is then provided by a cathode sputtering operation with a thin, electrically conductive layer of a bonding agent (for example zinc, of a thickness of about 5 mm), in order to provide for good electrical contact in respect of the photoelectrically operative layers which are to be subsequently applied.

The photactive, that is to say photoelectric or photovoltaic individual or double layers 6; 4, 5 are then successively applied in consecutive operating stations in the form of thin coherent layers of uniform thickness on the center electrode 2.

For the purposes of producing a photoelectric layer of low molecular photoactive compounds, they are advantageously dissolved in organic solvents such as benzene, acetone, methylene chloride, ethylene glycol monoethyl ether and the like, or in mixtures of such solvents. Suitable binding agents (for example synthetic or natural resin or resins) are desirably also added together with doping agents and possibly colour sensitizers, as referred to hereinbefore. If the photoactive compounds are used in mixtures with resin bonding agents, then the quantitative relationship between the resin and the photoactive substance may fluctuate within wide limits. Mixtures comprising two parts of resin and one part of photoactive substance up to mixtures which contain two parts of photoactive substance to one part of resin are preferred. Mixtures of the two substances with a weight ration of about 1:1 are particularly advantageous.

If the photactive layer itself is a high-polymer material, then there is no need to add a bonding agent and the desired doping agent or agents and color sensitizer or sensitizers is or are added to the solution of the polymeric photoelectric substance.

The coating may be applied for example by dipping, painting it on, applying it by means of a roller or spraying it. Any remaining solvent is removed by heating.

In addition, the coating on the solar cells 2 may also be applied in a screen printing operation, by vapor deposit or spraying onto the center electrode, or in the drawing operation through a nozzle. In one pass in the course of that continuous process, the doping operations in respect of the individual layers, which are possibly required, are preferably also carried out at the respective intermediate stages in the coating operation, as well as any intermediate heating operations which may be required. Inductive heating of the respective coating and/or heating by way of the metal center electrode from the interior may be advantageous and preferable in that respect. Similarly, it is also possible to provide for resistance heating through the thread-like electrode itself, at least at the beginning of the continuous process, by way of the metal center electrode.

Various processes may be employed for applying the counterelectrode 9 to the outward surface 10 of the photoactive layer 6, for example chemical and galvanic metallization processes, lining same with a metal foil material, vapor deposit of the metal, flame spraying, cathode sputtering, a plasma process, or the use of metal or graphite-filled coating materials which are applied by painting thereon.

Referring by way of example to FIG. 3, the counterelectrode 9 which is of semicircular configuration in cross-section therein may be produced for example by spraying through a mask from one side, with the side of the thread-like solar cell which is remote from the spray jet thus remaining uncoated. In that way the semicircular, that is to say generally concave counterelectrode 9 which preferably has a reflective surface on its inwardly facing side acts as a concave mirror or reflector within the solar cell.

Figure 2:
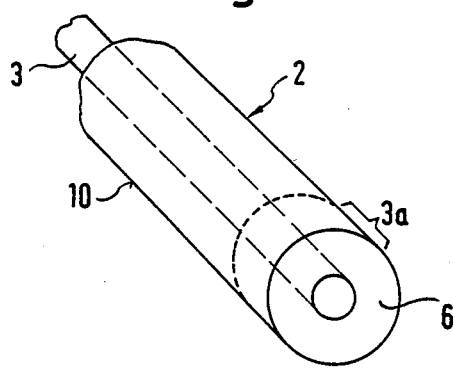
FIG. 2 is a partly broken-away perspective view of an individual solar cell element according to the invention from the arrangement shown in FIG. 1.

After the layer structure of the solar cell has been finished, the threads or wires are cut to portions of the desired length and, by selective removal of the coating, a short contact region is exposed on the center electrode 3, as indicated at 3a in FIGS. 1 and 2, at which the solar cell is then electrically connected.

Depending on the respective thickness of the casing structure 6 with photovoltaic layers, the center electrode 3 may occupy the main part of the cross-section of the cell, that is to say therefore in the case of a particularly thin organic casing structure 6, in which case the center electrode 3, being of a fully metal construction, may also be of a thin stranded-wire nature and can thus be flexible or bendable.

Figure 4:
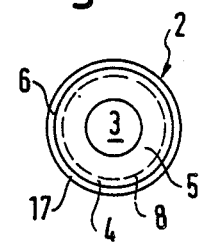
FIG. 4 is a sectional view of a modified embodiment embodiment of a solar cell element according to the invention for example as shown in FIG. 2.

On the other hand, referring now to FIG. 4, the relationship between the thickness of the layer structure forming the casing 6 to the diameter of the center electrode 3 may also be shifted to the advantage of the casing structure 6.

If no outer counterelectrode is necessary, then the insulation as indicated at 17 for example in FIG. 3 may lie directly around the outward side of the photovoltaic layers 6.

In further embodiments however, there is also no need whatever for that insulation around the individual solar cells.

Figure 5:
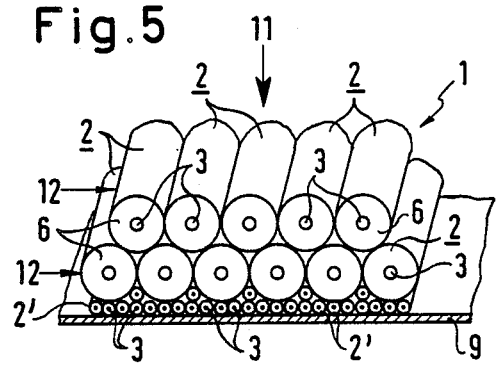
FIG. 5 is a partly broken-away perspective view of a modified embodiment of a solar cell arrangement according to the invention.

References will now be made to FIG. 5 showing a plurality of layers in superposed relationship of thread-like solar cells which are arranged parallel to each other in the respective layers. In addition to the parallel layers of solar cells, as indicated at 12, in which the individual solar cell elements 2 are displaced laterally relative to each other by a distance corresponding to the length of their radius so that they do not shade each other more than is necessary with their respective center electrodes 3, the FIG. 5 assembly also includes solar cells as indicated at 2' which are of smaller cross-section and which are of smaller cross-section and which are arranged in the gaps defined between the round cross-sectional configurations of adjacent solar cell elements. In the construction shown in FIG. 5, solar cells with different levels of photosensitivity may be combined together. Preferably the solar cells with the better level of sensitivity for short wavelengths are arranged at a lower position in FIG. 5.

The solar cell elements 2 and 2' shown in FIG. 5 are in contact with each other at their outside periphery sufficiently closely to ensure an interference-free flow of the electrical charges by way of the outer layers thereof. They also do not have any outside insulation but conduct the electrical charges produced by the incident light as indicated at 11 for example in FIG. 5 directly to a flat metal or metallized or electrically conductive counterelectrode 9.

Referring now also to FIG. 6, it will be seen therefrom that the solar cell elements 2 may be interconnected in the form of a woven fabric like structure as indicated at 13, with weft and warp threads. The individual solar cells 2 of the woven structure may be electrically connected at the underside of the weave junctions or intersections to a counterelectrode 9 so that the electrical charges flow between the center electrodes 3 and the flat counterelectrode 9 which may also be reflective.

An increase in the contact effect as indicated at 13a in FIG. 6 may also be achieved at the outward sides of the solar cells in which they are in contact with each other at the junctions of the threads making up the woven structure, by virtue of the solar cell elements being pressed together or by a heat treatment thereof or by using an electrically conductive adhesive.

If the weft threads and the warp threads of the weave-like solar cell arrangement shown in FIG. 6 are built up differently, that is to say reversed, in the sequence of the coating operation to produce the photoactive layers 4 and 5, then they can operate as tandem cells (in that respect reference may be made to FIGS. 12 to 15 which will be described in greater detail hereinafter); for example in that case an n-active surface layer of the weft threads is then in electrical transfer contact at the points of intersection with a p-active surface of the warp threads. In that arrangement there is no longer any need for the flat counterelectrode 9 but the electrical charge carriers are taken off (at double the voltage) from the center electrodes 3 of the warp threads and the center electrodes 3 of the weft threads. In that embodiment the solar cell arrangement 1 may also be in the form of partly translucent curtain arrangements.

Reference is now made to FIG. 8 showing a fleece or non-woven arrangement as indicated at 14, which can be formed in a similar fashion. In that arrangement the center electrodes 3 are connected directly to current bus bars 29 while the solar cells 2 are electrically connected by way of their outward sides to a flat current conductor path or track 24 acting as a counterelectrode.

In FIGS. 7 and 11, the counterelectrode is in the form of an electrically conducting thread or wire or a metal or metallized thread or wire which can be wound in a spiral around the casing portion of each solar cell 2 or which, as shown in FIG. 7, is wound in a spiral configuration around the solar element 2 itself.

FIG. 11 shows thread-like solar cells 2 which are arranged around such a thread as a counterelectrode 9, in a cable-like configuration or in a bunch arrangement, with a plurality of center electrodes 3 being electrically associated with a common counterelectrode 9.

As shown in FIGS. 9 and 10, the individual solar cell elements 2 may also be of a cross-section which is other than round. In the case of a prismatic cross-section as used in the arrangement shown in FIG. 9, the provision of particular prism angles can provide for advantageous internal total reflection. In that arrangement, a convex surface configuration 18 may be provided on the side at which the incident light is to be found, as indicated at 11 in FIG. 9.

The elliptical configuration of the solar cells 2" in FIG. 10 can also be produced by subsequently pressing solar cell elements 2 of initially round cross-section which are laid together in parallel layers as indicated at 12.

The above-described layer structure of the casing portion 6 formed by n- and p-layers or semiconductor layers 4, 5 may be supplemented by being combined with one or more intrinsic, preferably undoped i-layers 7, for which purpose the thread-like structure of the solar cells 2 is particularly well suited.

Figure 13:
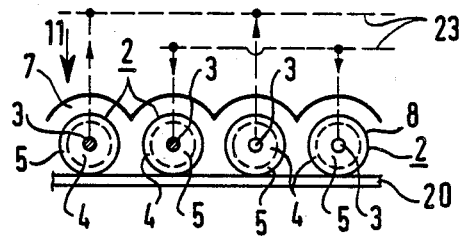
FIG. 13 is a diagrammatic view in cross-section of a layer of solar cells according to the invention which are arranged in parallel relationship with each other, with alternating semiconductor layer structure.

Referring now to FIG. 13, a plurality of solar cells 2 are arranged at a spacing from each other and parallel to each other on a carrier as indicated at 20. Each two adjacent solar cells 2 are of a respectively reversed layer configuration, so that each two juxtaposed center electrodes 3 from the respective opposite electrical poles and are connected to different current bars 23, which corresponds also to the situation in FIG. 12.

Instead of the optional contact reinforcement effect as indicated at 10a in FIG. 12, in FIG. 13 the thread-like solar cells 2 are embedded into an i-layer 7 and are connected together by way thereof, in a tandem circuit relationship.

Figure 14:
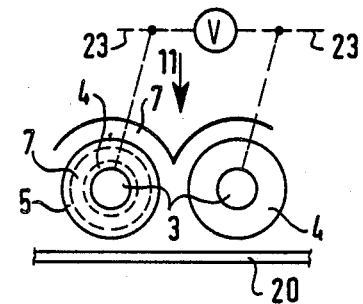
FIG. 14 is a modified form of the embodiment shown in FIG. 13.

In the arrangement shown in FIG. 14, and i-layer 7 as referred to above is also provided within the casing structure 6, more particularly at the location of the barrier layer 8, in order to enlarge the barrier layer.

Figure 15:
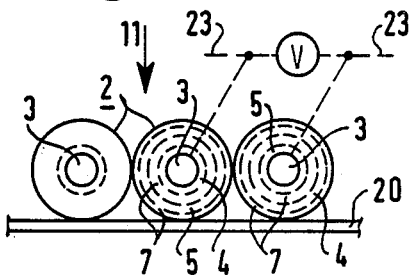
FIG. 15 is a further modified form of the embodiment shown in FIG. 13.

In the FIG. 15 arrangement, the solar cells 2 which are arranged in parallel juxtaposed relationship are in contact with each other by way of an additional encasing i-layer 7.

Figure 16:
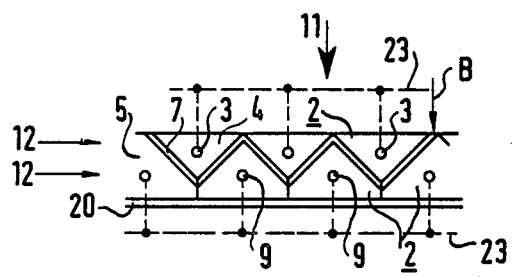
FIG. 16 is a double-layer construction according to the invention with different thread cross-section.

Referring to FIG. 16, that arrangement involves a modification, approximately corresponding to the configuration shown in FIG. 9, of a layer-wise solar cell arrangement 1, more particularly with the inclusion of an i-layer 7 which, as shown by the arrow B in FIG. 16, also projects as far as the surface of the arrangement at which the incident light is to be found as indicated at 11. In FIG. 16 the superposed parallel layers 12 of solar cell elements are of different structures. The center electrodes 3 of the upper parallel layer 12 are encased with an n-layer as indicated at 4 while the lower electrodes, constituting therefore counterelectrodes 9, are encased with a p-layer 5. The coatings on the two electrodes may be electrically connected together by way of an i-layer 7.

The above-described embodiments which have been set forth by way of example show the wide range of possible uses of thread-like or wire-like solar cells, in a very wide spread of different electrode assemblies.

Figure 17:
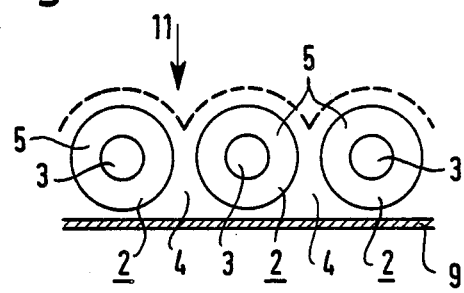
FIG. 17 is a basic form in accordance with the invention of use of an electrode assembly conforming to the principles of the present invention.
Figure 18:
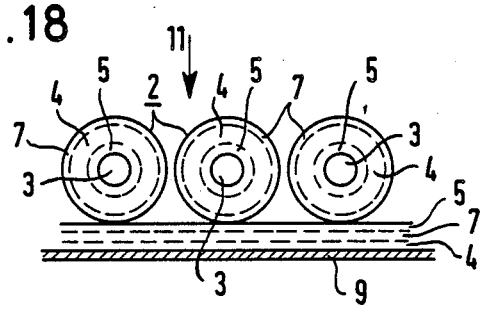
FIG. 18 is a further modified embodiment of an electrode assembly according to the invention.

Reference will now be made to FIGS. 17 and 18 showing further embodiments of solar cell arrangements 1 in which center electrodes 3 which are disposed in parallel juxtaposed relationship are only encased with one semiconductor layer, either a casing portion in the form of a p-layer 5 or an n-layer 4. To make up the structure of a solar cell 2, the components are embedded into a layer of the respective other material (that is to say n- and p-material respectively) and connected to an electrically conductive carrier consitituting the counterelectrode 9. An i-layer may also be included between the p-layer and the n-layer, as an outer casing portion around the thread element. The solar cell 2 may also be of a convex configuration on the incident light side as indicated at 11 in FIGS. 17 and 18.

In the FIG. 18 structure, a plurality of juxtaposed solar cell elements which do not touch each other at their peripheries are arranged on a counterelectrode 9 which is coated with photovoltaically operative material. In that arrangement the uppermost p-layer 5 of the coating of the counterelectrode is connected to a p-layer 5 which is disposed around the center electrode 3, by way of respective i-layer casing portions as indicated at 7 on a n-layer 4, thus providing a tandem cell arrangement between the counterelectrode 9 and the respective center electrode 3. In that arrangement the inclusion of an i-layer or even further i-layers is expressly only an alternative.

Figure 19:
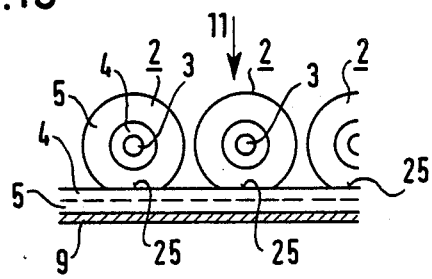
FIG. 19 is a view in cross-section through part of a further modified combination embodiment in accordance with the invention.

Referring finally to FIG. 19, when using a combination of thread-like or wire-like solar cells 2 with flat solar cell structures, the contact surfaces as between the different kinds of cells may be provided with complex surface portions of enlarged area as indicated at 25 in order thereby to reduce the internal resistance of the solar cells, by flattening the solar elements at one side or by removing material at one side, as can be clearly seen from the sectional view in FIG. 19. Alternatively, in FIG. 19 the individual solar cells 2 may also be in close contact with each other at lateral positions, possibly also by way of flattened portions thereof. Such increases in the area of the contact surfaces may also be provided for in all the embodiments described hereinbefore.

It will be appreciated that the above-described constructions and the processes for the production thereof have been set forth solely by way of example and illustration of the principles of the present invention and that various modifications and alterations may be made therein without thereby departing from the spirit and scope of the invention

What is claimed is:

1. A solar cell arrangement including a plurality of solar cell elements, wherein each solar cell element comprises:
    an elongate base electrode; and
    a photovoltaic layer of n-type or p-type disposed about said elongate electrode,
    said elements being arranged within said solar cell arrangement such that elements having a p-type photovoltaic layer are so positioned with respect to elements having an n-type photovoltaic layer that the base electrode of each element functions as the counterelectrode of the adjacent elements.

2. An arrangement as set forth in claim 1 wherein each base electrode carries an additional photovoltaic layer such that each electrode carries contacting n-type and p-type layers.

3. An arrangement as set forth in claim 2 wherein a plurality of said solar cell elements are arranged in a plane in mutually parallel juxtaposed relationship.

4. An arrangement according to claim 2 wherein a plurality of said solar cell elements are arranged in more than one layer and in superposed relationship and in electrical contact at their peripheries.

5. An arrangement as set forth in claim 4 wherein the elongate center electrodes are arranged in laterally mutually offset relationship.

6. An arrangement as set forth in claim 4 wherein said solar cell elements are of differing diameters.

7. An arrangement as set forth in claim 4 wherein said elements in each layer are sensitive to a different portion of the sun's radiation spectrum.

8. An arrangement as set forth in claim 2 wherein the individual solar cell elements are of a thread-like configuration.

9. An arrangement as set forth in claim 8 wherein said individual solar cell elements have a convex surface on the light incident side.

10. An arrangement as set forth in claim 2 wherein the individual solar cell elements are connected together in a woven structure.

11. An arrangement as set forth in claim 10 wherein the solar cell elements are connected together to provide a woven structure and wherein the solar cell elements forming the weft threads of the woven structure have outer photovoltaically operative layers opposite from those of the warp threads, said threads being in electrically conductive contact at the points of intersection of the solar cell elements in the woven structure, and wherein the elongate base electrodes of the weft threads and the elongate base electrodes of the warp threads are the opposite poles of the elements making up the said woven structure.

12. An arrangement as set forth in claim 11 wherein said woven structure is at least partially light-transmissive.

13. An arrangement as set forth in claim 2 wherein the individual solar cell elements are connected together in a non-woven structure.

14. An arrangement as set forth in claim 13 wherein the base electrodes of certain of said elements are connected to a first conductor and wherein the base electrodes of certain of said other elements are connected to a second conductor.

15. An arrangement as set forth in claim 2 wherein said base electrode occupies the predominant portion of the cross-sectional area of the element in comparison with the photovoltaic layer enclosing same.

16. An arrangement as set forth in claim 2 wherein said photovltaic layer comprises a flexible organic material.

17. An arrangement as set forth in claim 16 wherein said photovoltaic layer comprises a plurality of layers of different plastic compounds.

18. An arrangement as set forth in claim 2 wherein said photovoltaic layer comprises a plurality of different photovoltaic layer portions combined from photoactive organic and inorganic substances.

19. An arrangement as set forth in claim 2 wherein the photovoltaic layer includes color sensitizing means.

20. An arrangement as set forth in claim 2 including activator means for the sensitization of photoactive substances.

21. An arrangement as set forth in claim 2 wherein the individual solar cell elements are embedded in a layer of conductive material.

22. An arrangement as set forth in claim 2 wherein a respective intrinsic undoped i-layer is provided between each individual element.

23. An arrangement as set forth in claim 2 wherein said photovoltaic layers are shaped in the form of a triangle.

* * * * *